United States Patent [19]

Thompson et al.

[11] Patent Number: 4,649,515

[45] Date of Patent: Mar. 10, 1987

[54] METHODS AND APPARATUS FOR SYSTEM FAULT DIAGNOSIS AND CONTROL

[75] Inventors: Timothy F. Thompson, Pittsburgh; Robert M. Wojcik, Greensburg, both of Pa.

[73] Assignee: Westinghouse Electric Corp., Pittsburgh, Pa.

[21] Appl. No.: 881,499

[22] Filed: Jul. 1, 1986

Related U.S. Application Data

[63] Continuation of Ser. No. 605,704, Apr. 30, 1984, abandoned.

[51] Int. Cl.[4] ............................................ G06F 11/00
[52] U.S. Cl. .................................... 364/900; 364/300; 371/15; 371/20
[58] Field of Search ... 364/200 MS File, 900 MS File, 364/300; 371/15, 16, 20

[56] References Cited

U.S. PATENT DOCUMENTS 4,561,093 12/1985 Doane et al. ........................... 371/20
4,567,560 1/1986 Polis et al. ......................... 371/15 X

OTHER PUBLICATIONS

"R1: A Rule-Based Configurer of Computer Systems" by John McDermott, Artifical Intelligence 1982.
"Rule-Based Expert Systems the MYCIN Experiments of the Stanford Heuristic Programming Project" Edited by B. G. Buchanan & E. H. Shortliffe, Addison-Wesley Publishing Co.
"Knowledge Engineering Techniques and Tools in the Prospector Environment" by Rene Reboh, Jun. 1981, Technical Note 243, SRI International.
"Meta-Rules: Reasoning About Control" by R. Davis, Artifical Intelligence, Dec. 1980, pp. 179-239.

*Primary Examiner*—Raulfe B. Zache
*Attorney, Agent, or Firm*—D. R. Lackey

[57] ABSTRACT

Method and apparatus for monitoring and diagnosing sensor and interactive based process systems. The knowledge base concerning the process system per se is in the form of a list stored in memory, which list includes domain specific rules in evidence-hypothesis form. This domain dependent information is devoid of means for interconnecting the rules to perform diagnostic services. A completely domain independent set of meta-level rules is stored in memory, which, in response to sensor and/or user input, searches the knowledge base and effectively constructs a rule network through which belief is propagated, to detect and report malfunctions, to output control signals for modifying the operation of the monitored system, and to aid users by providing information relative to malfunctions which pinpoints probable causes. The domain independent rules, in addition to the meta-level rules which search the knowledge base and interconnect domain specific rules, includes procedural rules for choosing which of the meta-level rules to apply when there is a choice. The procedural inference rules are independent and distinct from the meta-level rules which manipulate the knowledge base.

34 Claims, 15 Drawing Figures

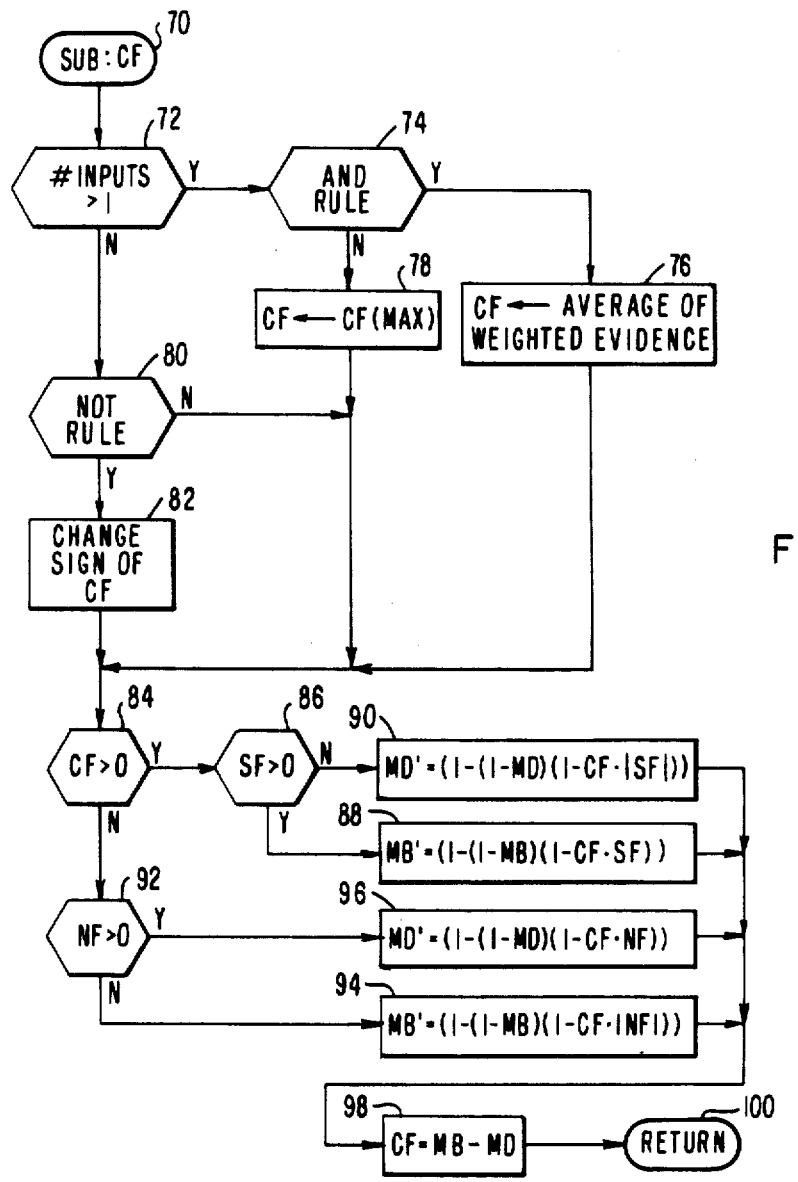

METHODS AND APPARATUS FOR SYSTEM FAULT DIAGNOSIS AND CONTROL

This application is a continuation of application Ser. No. 605,704 filed Apr. 30, 1984, now abandoned.

BACKGROUND OF THE INVENTION

1. Field of the Invention

The invention relates in general to fault diagnosis, and more specifically to a generic facility for the construction of knowledge based expert systems for sensor and interactive based process diagnosis.

2. Description of the Prior Art

Expert systems have been typically characterized by a knowledge base and an inference engine. The knowledge base usually consists of rules specific to the task domain and the inference engine usually consists of a set of procedures which manipulate the task specific rules. Prior art examples are programs for medical diagnosis and mineral exploration. These prior art systems have rigid procedural mechanisms for dealing with belief and disbelief and hypotheses. The rules for belief propagation are, in a sense, "hard wired" into the procedural inference engine in a manner similar to the instruction-fetch unit in typical computers. As a result, the structure of the domain-specific rules is also rigid. The domain expert must formulate his knowledge into the exact structures demanded by the form of the rules.

Another prior art expert system, which configures computer systems, demonstrates another method by which an expert system may be constructed. In this system, the basic inference mechanism is stripped of all task-specific knowledge. The task specific knowledge or rule base embodies not only knowledge about the task domain, but also knowledge about how best to apply the rule base in order to accomplish a particular goal. The task-specific domain knowledge and knowledge about task control are integrated into productions or rules. Some productions are used strictly for control, such as rules to add or remove a sub-task context, but most rules have control information integrated into preconditions into their left-hand sides, i.e., the antecedent of the antecedent-consequent production rule form. Integrating the task domain knowledge with the task control knowledge results in a system architecture which is appropriate only to a certain set of highly structured domains. For example, this prior art method does not deal with uncertainty in its reasoning process, and it has no mechanism for "backing up" if it makes a poor decision. The program assumes that it has enough knowledge to bring to bear to correctly choose each rule to apply at every step. In complex task domains, however, building enough control knowledge into the object-level rules is both time-inefficient and more difficult for the "knowledge engineer" (the builder of the rule base) to accomplish. The task of configuring computers may be sufficiently structured that the system can effectively know all there is to know at each step in the computer configuration process, and consequently, it can make the right choices the first time. However, most diagnostic domains are too complex and too ill-structured for this approach to be feasible. While in this prior art system for determining computer configuration, the task control knowledge has been removed from the inference engine, which has certain advantages, it has mixed it with the task domain knowledge, which, in complex domains, has other important disadvantages.

There is also an issue of whether or not input to the expert system is reliable. Many systems merely assume that input from the user is always reliable. Some prior art systems assume that the domain is sufficiently well structured that, with a rudimentary pre-processing package which checks for input consistency and feasibility, any problems with user input can be easily resolved. Other systems try to deal with unreliable input by allowing the user to specify a measure of certainty for each input value. This measure of certainty is then propagated along with the input value throughout the object-level rule base. In effect, the process of reasoning about the reliability of the input is removed from the expert system and assigned to the user. Neither the assumption that dealing with unreliable input is trivial, nor the practice of off-loading the responsibility of handling unreliable input to the user, is an adequate solution for complex systems.

Another prior art system employs techniques referred to as "retrospective analysis" and "meta-diagnosis" to handle the problems of spurious sensor readings and sensor degradation. Retrospective analysis refers to the process of maintaining a history of sampled sensor inputs so that spurious readings can be detected and processed appropriately. In most cases, this involves some sort of averaging technique which is augmented, perhaps, with a conversion to engineering units. Meta-diagnosis is a technique whereby the long-term behavior of individual sensors is monitored. When an aberration is detected, the importance of the sensor is diminished through the use of explicit "parametric-alteration" rules.

Thus, previous expert systems have either chosen to ignore the problem of reasoning about their inputs, or they have included some primitive, procedurally encoded mechanisms which suffer from being difficult to modify or extend. The result is a reasoning capability which is limited by the rigid constraints of the design of the procedural inference engine.

SUMMARY OF THE INVENTION

Briefly, the present invention includes new and improved methods and apparatus for developing a generic facility for the construction of any knowledge-based expert system, as opposed to the development of any specific system. The system is based upon a hierarchy of rules. At the lowest level are the system's object-level rules which are specifically directed to providing evidence for diagnosing a particular process, system, or piece of apparatus. Above the object-level rules are the meta-level inference rules which include means for reasoning about the veracity of the input to the system, about the control strategy which determines the order in which the object-level rules are applied, and about how these object level rules were chosen for the purpose of explaining belief in the system's conclusions. At the top of this hierarchy of rules is a generic procedural inference mechanism with no domain-specific knowledge which chooses meta-level rules to apply when there is a choice, based on criteria which can be selected by the user, e.g., depth-first, breadth-first, best-first search, etc. The meta-level rules might logically be compared to the control structure in a typical graph search problem. The problem is basically one of selecting the best node (hypothesis) for expansion, from the current "open" list, such that the optimum path to correct problem diagnosis is found in the shortest amount of time using a minimum of user input. In this comparison, the meta-level inference rules are analogous to the control strategy in a graph search. The domain dependent object-level rules are analogous to the operators used in changing states between nodes. Inputs, hypotheses, and malfunctions are analogous to the start nodes, intermediate nodes, and goal nodes in the search space.

In the present invention, the entire inference process, in whatever style, is implemented entirely in a meta-level rule structure which is completely distinct from the object-level rule base. In the meta-level, the procedural rules which select the inference rules when there is a choice, are completely distinct from the inference rules which select and apply the object level rules. This architecture provides tremendous flexibility in building an expert system to meet any specified need. It provides the ability to easily make changes in the object-level rule base, as well as in the dual level of the meta-level rule base, because the rules are separate and their structures interact minimally.

BRIEF DESCRIPTION OF THE DRAWINGS

The invention may be better understood, and further advantages and uses thereof more readily apparent, when considered in view of the following detailed description of exemplary embodiments, taken with the accompanying drawings, in which:

FIG. 5 is a diagram which illustrates the logic used in selecting the measure of belief MB, or the measure of disbelief MD, for updating;

FIG. 6 is a procedural flow diagram which sets forth a sub-program CF which may be called by other programs for determining the certainty factor CF of the hypothesis of a domain dependent rule;

DESCRIPTION OF PREFERRED EMBODIMENTS

Figure 1:
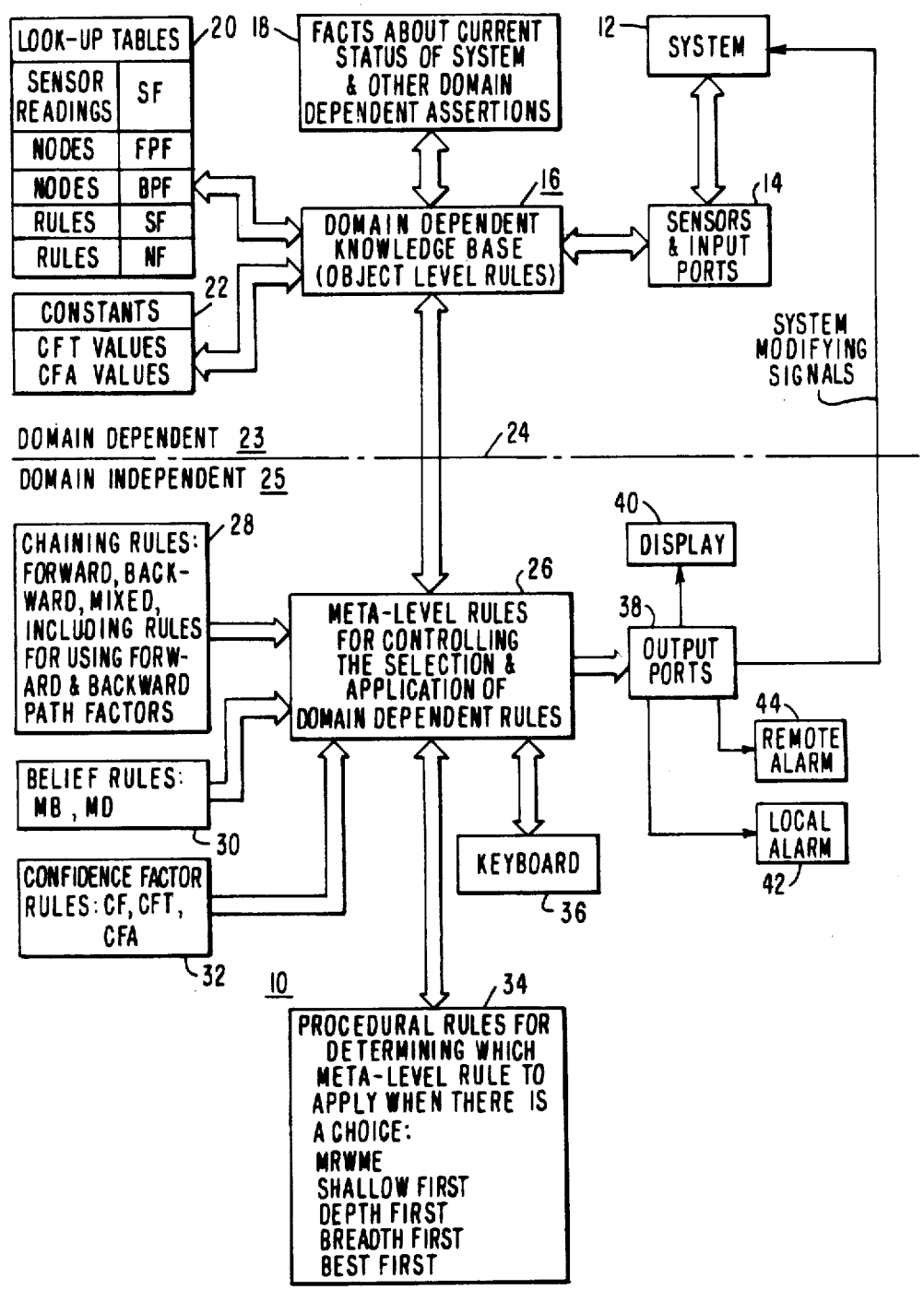
FIG. 1 is a block diagram which sets forth an expert diagnostic system constructed and arranged according to the teachings of the invention.

Referring now to the drawings, and to FIG. 1 in particular, there is shown a block diagram of an expert system 10 constructed according to the teachings of the invention. The expert system 10 monitors the system, it detects malfunctions, it provides control signals, and it aids service personnel in diagnosing system faults. The invention does not pertain to a specific expert system, but teaches how to improve upon the construction of any expert system, for any system 12 which uses sensors as inputs. The system, as well as being sensor based, is also usable in interactive modes for aiding service personnel in diagnosing system malfunctions. While the invention does not pertain to a specific expert system, specific examples to be hereinafter set forth will pertain to the detection and diagnosing of malfunctions in an elevator system, since a first application of the invention pertains to an elevator system.

Arrangement 10 is based upon a hierarchy of rules. At the lowest level of this meta-level architecture are domain specific object-level rules, which include information useful in diagnosing malfunctions in system 12. Above the object-level rules are domain independent meta-level rules which include means for giving different weights to the sensor inputs to the system, and they provide the control strategy for determining the order in which the object-level rules are applied. The meta-level rules also include means for storing information about how the object-level rules were chosen, for the purpose of explaining belief in the system's outputs. At the top of this hierarchy of rules is a generic inference mechanism with no domain-specific knowledge, which chooses meta-level rules to apply when there is a choice, based upon criteria which can be selected by the user.

More specifically, the invention includes a plurality of sensors 14 arranged to provide input data relative to the sensor-based system 12. The sensors 14 monitor and collect data relative to system 12, with the sensors collecting data in analog and/or digital form, as required by the specific system. The data from sensors 14 are applied via suitable input ports to computer memory means 16, such as a random access memory (RAM). The computer associated with memory 16 may be on-site or remote, as desired. Modems may be used for remote communication. Memory means 16, in addition to including storage space for the sensor data, includes a memory, such as disc storage, for storing a domain dependent knowledge base in the form of object-level rules. The object level rules contain information provided by an expert or experts, in the field associated with system 12, with a knowledge engineer taking the domain specific information and placing it in the form of object level rules. The object level rules are not coded as part of a computer program, but they are in the form of a list, or lists, which may be easily changed, e.g., added to, deleted from, and/or modified, and easily searched by list processing computer languages, such as LISP or versions thereof.

Each object-level rule has an antecedent which may include one or more pieces of evidence, and a consequent which may be an actual process malfunction or an intermediate hypothesis. Each hypothesis or node may be used as evidence for a higher level rule. In addition, each object-level rule has an associated sufficiency factor SF and necessity factor NF. Each hypothesis and malfunction has an associated measure of belief MB, measure of disbelief MD, and an aggregate confidence factor CF. In general, the sufficiency factor SF is used as a measure of how strongly the domain expert feels that supporting evidence should contribute to positive belief in the hypothesis, and the necessity factor NF is used as a measure of how strongly contrary evidence, or lack of evidence, should increase disbelief in the hypothesis. Thus, the object level rules have assigned values which enable the meta-level rules to make assertions based upon the strength of the evidence to each object-level rule. Therefore, the meta-level rules do not merely make assertions which are assumed to be either true or false, but rather enable "reasoning" to take place, using gradations of belief in the assertions.

System 10 includes additional computer memory locations 18, 20 and 22. Memory location 18 includes information about the current status of the system 12, and other domain dependent assertions which are not in the form of object level rules. For example, if system 12 is an elevator system, memory 18 would include facts about the elevator system such as the number of floors in the associated building, the locations of specific floors, such as lobby floors, restaurant floors, garage floors, the number of cars in the elevator system, the number of cars currently in service, the floors each car can serve, and the like. Memory 20 includes look-up tables which store values SF associated with the sensor readings, constants FPF and BPF associated with the nodes (hypotheses), formable in a rule network, and the hereinbefore-mentioned constants SF and NF associated with each of the object level rules. Memory means 22 may store predetermined system related constants, such as CFT and CFA values, as will be hereinafter explained. The CFT and CFA values, instead of being system related, may also be node related, in which event, they would be stored in memory 20.

The description of arrangement 10 to this point describes information which is domain dependent, i.e., specifically related to the system 12, and this information is the information 23 located above a broken line 24 which separates domain dependent and domain independent information 23 and 25, respectively.

The domain independent information 25 of arrangement 10 includes meta-level rules which contain the entire inference process, which is completely distinct from the object level rule base. In other words, the domain dependent information 23 includes no information on how to connect the object level rules 16, or how to otherwise use the disparate bits of domain dependent information to detect and diagnose system malfunctions. On the other hand, the domain independent information 25 may operate with any domain dependent information 23, and is the part of system 10 which includes computer programs. This arrangement provides the ability to make changes both to the object-level rule base and to the meta-level rule base easily and painlessly, because the two kinds of rules are completely separate and have minimal interaction.

More specifically, the meta-level rules of the domain independent information 25 are divided into two levels, with a first level including memory means 26 in which rules are stored which: (a) take into account the veracity of the sensor inputs, (b) determine which object level rules to apply to detect and diagnose system malfunctions in an expedient manner, and (c) explain how system conclusions were reached. As indicated in Table I below, these rules include chaining rules indicated in memory block 28, such as forward chaining. Forward chaining starts at the sensor level and works towards the malfunction hypotheses. These rules also include backward chaining. Backward chaining starts with a user supplied malfunction, and the program works from this malfunction node back to the sensor level, to determine which sensor inputs are pertinent. These rules also include mixed inference chaining, which utilizes both the principles of forward and backward chaining in a unique manner to build from a few pieces of evidence while directing a user as to whatever pieces of evidence are necessary in order to continue system diagnosis. Rules for using forward and backward path factors FPF and BPF, respectively, are also included in memory block 28.

TABLE I

META LEVEL RULES
-BELIEF PROPAGATING-

Forward Chaining Rules
Backward Chaining Rules
Mixed Chaining Rules
Rules for Forward & Backward Path Factors
Rules for Handling MB(H) & MD(H)
Rules for Determining CF(H)
Rules Re Confidence Factor Thresholds (CFT)
Rules Re Confidence Factor Assumption
Rules for Determining Sensor SF The first level of meta-level rules also includes rules for determining the measure of belief MB and the measure of disbelief MD relative to a specific hypothesis, with these rules being indicated in memory block 30. Rules concerning confidence factors are indicated in memory block 32. These rules include rules for determining a confidence factor CF relative to a hypothesis, rules relative to the use of the confidence factor threshold values CFT, and rules for using the confidence factor assumption value CFA.

The second level of the meta-level rules includes procedural rules indicated in memory block 34, which determine which of the first level metal-level rules to apply when there is a choice. The rules at the second level may be user selected. As indicated in Table II below, these rules include such options as the most recent working memory element (MRWME), which rules include means for storing the time when each object level rule is successfully applied, also hereinafter referred to as "fired". Other procedural rules which may be used are those from graph searching techniques, such as shallow first, depth first, breadth first, best first, and the like.

TABLE II

-META LEVEL RULES-
PROCEDURAL

Most Recent Working Memory Element (MRWME):
Shallow First;
Depth First;
Breadth First;
Best First The arrangement of FIG. 1 has different operating modes, including modes which are interactive, such as the backward chaining and mixed inference chaining modes. A keyboard 36 enables a user to enter information for use by the program which applies the meta-level rules. The program which applies the meta-level rules also includes output ports 38 for communicating and sending signals to a variety of output devices, such as a display 40 for use in an interactive mode. The display 40 may include voice synthesis, if desired. Non-interactive modes, such as forward chaining entirely from sensor inputs, may include output ports for sending signals to the system 12. For example, when predetermined malfunctions are detected, predetermined signals associated therewith may "fire", which, among other things, may modify the operation of system 12. For example, when system 12 is an elevator system, a signal from output port 38 may control a relay in the safety circuit of the elevator, shutting down specific elevator cars, or even the entire elevator system, depending upon the nature of the malfunction. Simultaneously, while modifying system 12, signals from output ports may actuate local alarms 42, and/or remote alarms 44. The latter may use auto-dial modems, for example.

Figure 2:
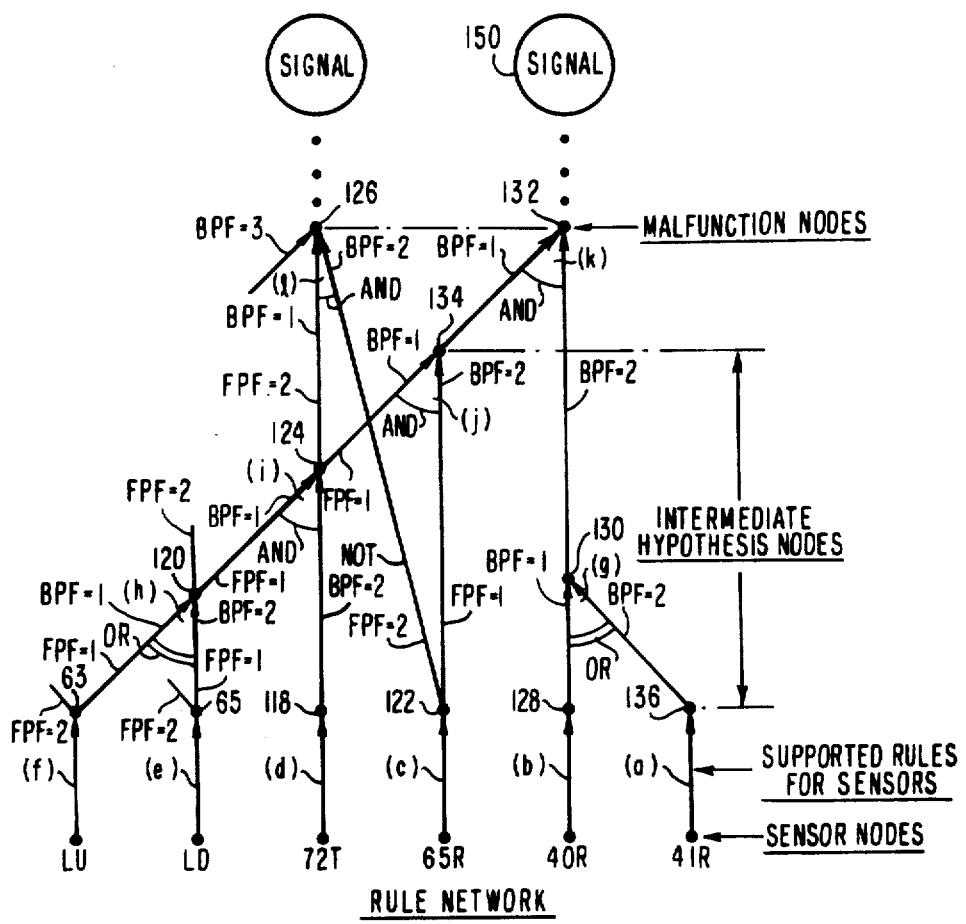
FIG. 2 is a rule network diagram which will be used as an example when explaining different methods of propagating belief in hypotheses, according to the teachings of the invention.

In describing the procedural flow charts of FIGS. 4, 6, 7 and 8, which teach the new and improved methods of the invention, it will be helpful to use the rule network shown in FIG. 2. The rule network is an inference net of logical nodes and logical rules created by the inference program for its own use, and is transparent to the user. The references 41R, 40R, 65R, 72T, LD and LU are sensor nodes which represent inputs from sensors which monitor the conditions of elevator system relays having the same identifying indicia. U.S. Pat. Nos. 4,436,184; 4,042,068; and 3,902,572, for example, may be referred to for more information regarding these relays, if desired. Arrows (a) through (f) in FIG. 2 represent sensor supported rules, which are supported by the sensor nodes. Table III sets forth rules (a) through (f) in IF:THEN form, with the evidence on the left-hand side (LHS), and the hypothesis on the right-hand side (RHS) of each rule.

TABLE III

SUPPORTED RULES FOR SENSORS

| RULE | IF: | THEN: |
|---|---|---|
| (a) | Relay 41R is deenergized | Hatch door is not locked |
| (b) | Relay 40R is deenergized | Car door is not closed |
| (c) | Relay 65R is energized | Car is running |
| (d) | Relay 72T is deenergized | Car is not releveling |
| (e) | Relay LD is energized | Down leveling switch not on cam |
| (f) | Relay LU is energized | Up leveling switch not on cam |

The nodes pointed to by the arrows represent the hypotheses of the rules, and these nodes are used as evidence for firing higher level object level rules. Object level rules (g) through (l) are set forth in Table IV. The intermediate hypothesis nodes may also be referred to as logical nodes, with AND nodes having the evidence arrows interconnected by a single curved line, OR nodes having the evidence nodes interconnected by two spaced curved lines, and NOT nodes being indicated by the word NOT. The associated rules are logical rules, with the hypotheses or logical nodes being used as evidence for still higher level object rules. Malfunction nodes are similar to any other hypothesis node, except they are not used to support any higher rules. In other words, malfunction nodes are associated only with supporting rules, not supported rules.

TABLE IV

OBJECT LEVEL RULES

| RULE | IF: | THEN: |
|---|---|---|
| (g) | (a) OR (b) | Hatch door not locked or car door not closed |
| (h) | (e) OR (f) | Car is not at floor level |
| (i) | (h) AND (d) | Car is not at floor level and not releveling |
| (j) | (i) AND (c) | Car is not at floor level, not releveling, and running |
| (k) | (j) AND (g) | Car is not at floor level, not releveling, running, and car door not closed or hatch door is not locked |
| (l) | (i) AND NOT (c) | Car is not at floor level, not releveling, and not running |

Certain information is stored in memory relative to the nodes and rules, with Tables V, VI and VII illustrating suitable formats for sensor nodes, hypothesis nodes, and object level rules, respectively.

TABLE V

SENSOR NODE

Name of Sensor
Value of Sensor Reading
Engineering Units of Reading
Time @ Which Reading Was Taken
MB = 1
MD = 0

TABLE VI

HYPOTHESIS NODE FORMAT

Description of Node
CF (H) - Confidence Factor
MB (H) - Measure of Belief
MD (H) - Measure of Disbelief
Rules Using Node as Evidence (Supported)
Rules For Which Node is Hypothesis (Supporting)
Signal Associated With Node
Update Flag - True When MB and MD Completely Updated

TABLE VII

RULE FORMAT

Figure 3A:
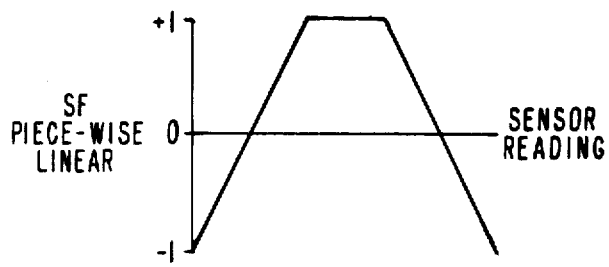
FIGS. 3A through 3F are graphs which set forth different mechanisms for measuring belief and disbelief in hypotheses, as well as certainty factors of the evidence and hypotheses.

Names of Evidence Nodes
Evidence as a Boolean Expression (IF:THEN)
Name of Hypothesis Node
CF - Confidence Factor of Evidence
SF(R) - Sufficiency Factor
NF(R) - Necessity Factor
FLAG - True When Rule Fires
Context Under Which Rule Fires
Relative Weights of Multiple Evidence Inputs For AND Rules Also, when the procedural flow diagrams are described, certain constants and determined values will be referred to. In order to aid in quickly determining what the values generally indicate, they are set forth in graph form in FIGS. 3A through 3F. FIG. 3A illustrates how piece-wise linear processing is used to develop a look-up table of sufficiency factor values SF for each analog sensor. A graph similar to that of FIG. 3A is determined for each analog sensor. Readings outside a predetermined range have a sufficiency factor SF of less than one, indicating that if the value is outside this range, the veracity of the data is suspect. In an actual system, the graph is in the form of a look-up table in read-only memory.

Figure 3B:
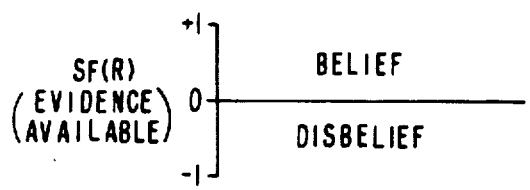
Figure 3C:
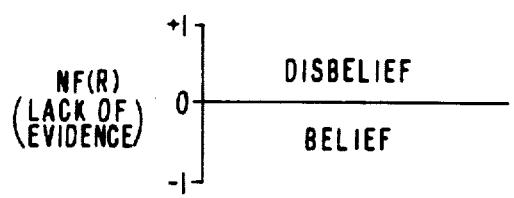
Figure 3D:
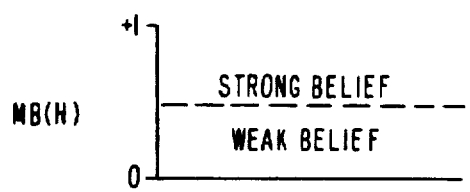
Figure 3E:
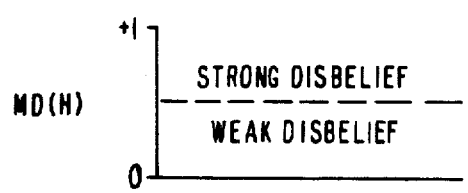
Figure 3F:
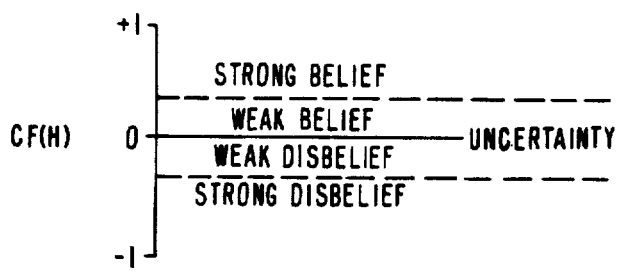

The domain expert assigns sufficiency factors SF and necessity factors NF to each object level rule, indicated in the graphs of FIGS. 3B and 3C, respectively. The sufficiency factor SF(R), which ranges from $-1$ to $+1$, indicates the belief in the hypothesis of the rule when it is known that evidence is present. The (R) indicates "rule related". A positive value indicates belief and a negative value indicates disbelief, with the magnitude indicating relative degrees of belief or disbelief.

The necessity factor NF, which is in the range of $-1$ to $+1$, represents the necessity of the evidence in proving the hypothesis of the rule true. If evidence is lacking, or it is contrary, a positive NF(R) indicates disbelief in the rule's hypothesis, while a negative NF(R) indicates belief.

The SF and NF values, which are constants, along with the confidence factors of the evidence, which are program determined, are used to determine the measure of belief MB and the measure of disbelief MD in the hypothesis under consideration. These values, shown in FIGS. 3D and 3E, respectively, range from 0 to 1, with values close to 1 indicating strong belief, and strong disbelief, respectively, for MB(H) and MD(H), and values close to zero respectively indicating weak belief and weak disbelief for MB(H) and MD(H). The (H) indicates "hypothesis related". Only the MB or the MD for a specific hypothesis is determined and/or updated per rule, depending upon the update logic shown in FIG. 5, as will be hereinafter explained.

The confidence factor CF of the hypothesis, which is the same as the confidence factor of the evidence when the hypothesis is used as evidence for a supported rule, is equal to the difference between MB and MD, and is thus a number between −1 and +1. Values around 0 indicate uncertainty, large positive values indicate strong belief, small positive values indicate weak belief, large negative values indicate strong disbelief, and small negative values indicate weak disbelief in the hypothesis of the rule being considered.

Figure 4:
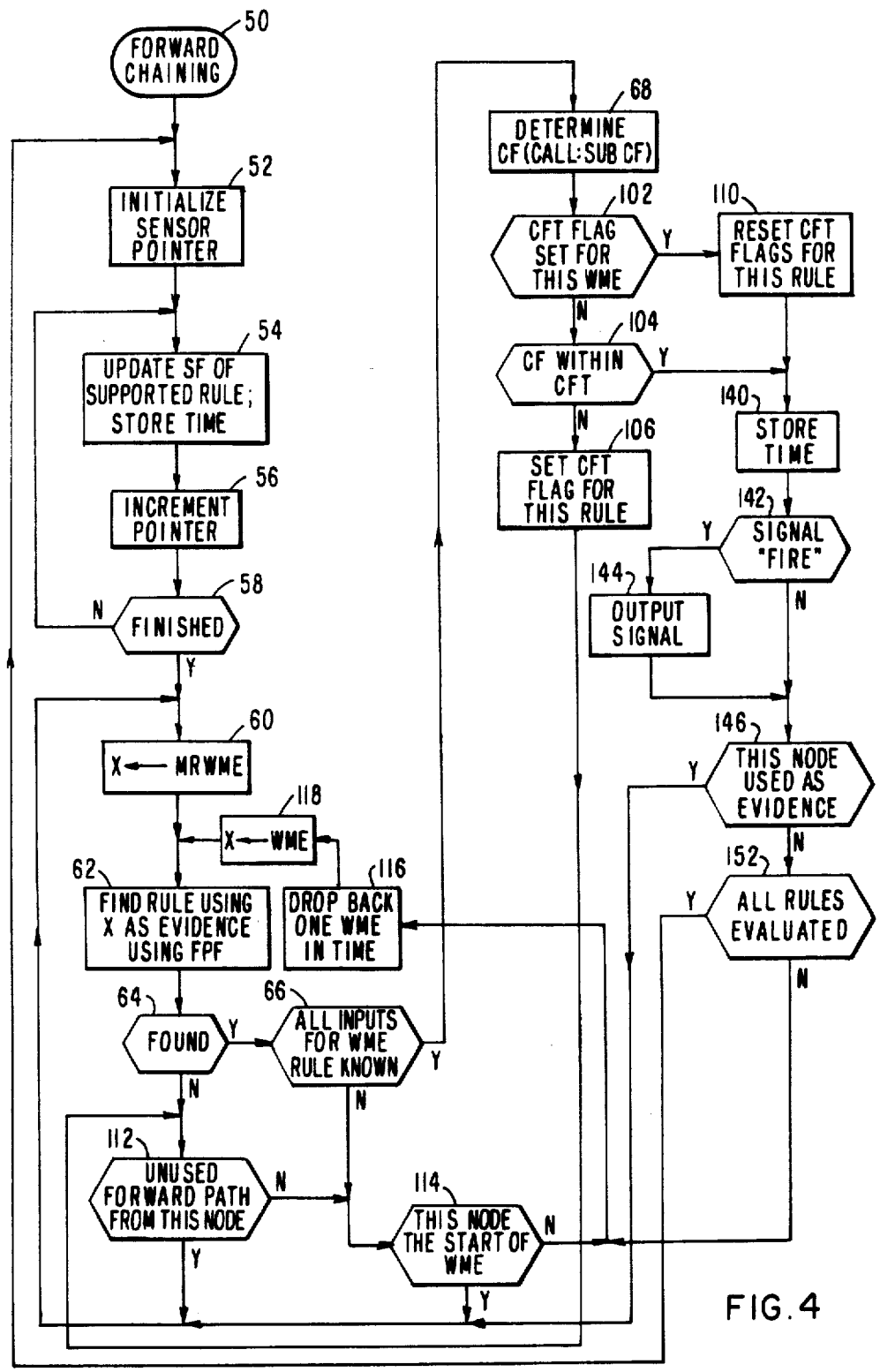
FIG. 4 is a procedural flow diagram which sets forth a forward chaining process, as conducted according to the teachings of the invention.

FIG. 4 is a procedural flow chart for an operating mode referred to as forward chaining, which is an on-line, real-time, sensor based, monitoring, diagnostic and control arrangement which starts from the sensor nodes and requires no input from a user, and no user interaction. The rule network of FIG. 2 will be referred to during the description of FIG. 4.

More specifically, the forward chaining program is entered at 50 and the first task is to fire the sensor supported rules. The sensor supported rules convert the sensor readings into a form usable by the diagnostic system. The format of the information stored relative to each sensor node is set forth in Table V. For sensors, the measure of belief MB is 1.0, the measure of disbelief MD is 0, and the confidence factor CF of each sensor node is thus 1.0 (CF=MB−MD). The sufficiency factor SF of the evidence for a sensor supported rule (NF is not used) is determined by the user defined piece-wise linear function, as explained relative to FIG. 3A. Thus, step 52 initializes a pointer to the list of sensors, and step 54 updates the sufficiency factor SF of the supported rule based on the sensor reading and fires the rule. This involves computing MB, MD and CF by, multiplying the updated SF by the CF of the sensor node (i.e., 1), to obtain the measure of belief MB. The confidence factor CF is equal to the difference between the MB and the MD, and since the MD of the sensor is 0, the confidence factor CF is equal to the measure of belief MB. With analog inputs, the SF would be determined from a look-up table for the specific value of the sensor input. With relays, which are either energized or deenergized, it is difficult to do any meaningful processing relative to the veracity of the input. The firing of a sensor supported rule in reality translates the absolute SF value of the sensor node to the MB (or MD when SF<0) of the supported rule. Step 54 also stores the time when the hypothesis of each rule is updated, as the firing of a rule causes its hypothesis to be classified as a working memory element WME, with the relative times when the rules are updated being a procedural method used by the meta-level procedural rules for determining which meta-level rule to apply when there is a choice, as will be hereinafter explained. Step 56 increments the pointer to the sensor list, each time a sensor is updated, and step 58 determines when the sensors have all been updated.

When the hypotheses of the sensor supported rules have all been updated, a procedural rule from memory block 34 determines where to start in the object level rule base, as there is a choice at this point. For purposes of example, when there is a choice, the most recently updated working memory element MRWME will be chosen. Thus, step 60 transfers the MRWME into a program variable X, and step 62 attempts to find a rule using X as evidence. When there is a choice of rules, the program is guided by forward path factors FPF. Each hypothesis node which supports more than one rule is assigned a FPF for each path, based upon which path the domain expert would take when faced with the same decision. The program selects the highest priority path which is not associated with a previously fired rule. Thus, in the example of FIG. 2, the MRWME after step 58 would be hypothesis node 63 associated with rule (f), if the sensors are updated in order starting with sensor 41R and ending with sensor LU. Step 62 searches the LHS's of the list of object-level rules, and would find rule (h) having node 63 as an input, since it has the highest priority FPF, as indicated in the diagram of FIG. 2. A rule using node 63 as evidence which has the FPF of two, would be ignored at this point. Step 64 checks to see if step 62 found a rule, and since it had, step 66 would check to see if all of the evidence inputs to rule (h) are known. Since the evidence inputs are node 63 associated with sensor supported rule (f), and node 65 associated with sensor supported rule (e), the evidence inputs are known, and step 66 proceeds to step 68 to determine the confidence factor CF of the rule (h). Step 68 calls subroutine CF shown in FIG. 6, to make this determination.

Subroutine CF is entered at 70, and step 72 checks to see if the number of inputs to rule (h) are greater than one. If so, step 74 checks to see if rule (h) is an AND rule. This is determined from the rule format shown in Table VII. Since rule (h) is an AND rule, the confidence factor CF of the evidence is determined by taking the weighted average of the certainty factor CF of the multiple inputs. Relative weights are assigned by the domain expert, and they appear in the rule format. If the rule is an OR rule, step 74 would go to step 78, which would set the CF of the evidence to the value of the CF of the evidence which has the highest CF. If step 72 finds only one input, step 80 checks to see if the rule is a NOT rule. If so, step 82 changes the sign of the CF of the evidence. If it is not a NOT rule, step 82 is by-passed, with the "NO" branch of step 80 and the outputs of steps 76 and 78 all proceeding to step 84.

Step 84 starts a process which either updates the measure of belief MB, or the measure of disbelief MD, in the hypothesis of the rule. Only one is updated. FIG. 5 illustrates the update logic in chart form. If the CF of the evidence is greater than zero, MB is determined or updated when SF is greater than zero, and MD is determined or updated when SF is less than zero. The MB or MD are updated for each rule having the same hypothesis. If the CF of the evidence is less than zero, the MD is determined or updated when the NF is greater than zero, and the MB is determined or updated when the NF is less than zero. This logic is implemented by steps 84, 86 and 92. When CF and SF both exceed 0, step 88 determines the new MB, given a prime mark in FIG. 6 to distinguish it from the prior or old MB, which is used in the right-hand side of the equation. If MB' is being determined for the first time, the value of the old MB is set to zero in the equation. Assuming the CF of the evidence is equal to one, and the SF is equal to 0.8, the latter being obtained from the rule format, step 88 would find that the measure of belief is 0.8. Steps 88, 94 and 96 are similar to step 90, except in step 90, the old MD is used, and the CF is multiplied by the absolute value of the SF. In step 94, the old MB is updated and the CF is multiplied by the absolute value of the NF. In step 96, the old MD is updated and the CF is multiplied by NF.

Steps 88, 90, 94 and 96 all proceed to step 98 which determines the CF of the hypothesis of rule (h) by subtracting the measure of disbelief MD from the measure of belief MB. In the example, CF would be equal to 0.8. The subroutine returns to the interrupted program at 100.

Returning to FIG. 4, step 102 checks to see if a confidence factor threshold flag CFT is set for the WME associated with node 63. At this point, it will not have been set, and step 104 checks to see if the CF is in the confidence factor threshold (CFT) range. The CFT range has a minimum value CFMIN and a maximum value CFMAX, which values are predetermined for each rule, or in some instances, may be one universal range applied to all of the rules, as desired. If CF is below CFMIN, it indicates that the confidence in the hypothesis of this rule is so low that the path will probably be unproductive, and the program will "back up" to look for more productive paths. If the CF is above CFMAX, it indicates that the confidence factor in the hypothesis of this rule is so high that there is small chance of finding a malfunction using this path, and again, the program backs up to look for a more productive path. At certain intermediate hypotheses, CFMAX will be set to "one", when it is too early to tell if something may be wrong. If step 104 finds CF is not within the CFT range, step 106 sets the CFT flag for the associated WME. The set flag indicates that the rule has been previously checked from this WME as the starting point, and not fired because the CF of the rule was outside the CFT range. If the program later comes back to this WME node because it failed to find anything more productive, the CFT test will be bypassed for one rule, with the set CFT flag directing the program to step 110 which resets the CFT flag, and step 110 also bypasses step 104.

Assuming that the CFT of rule (h) is outside the associated CFT range, step 106 goes to step 112 which is where the "NO" branch of step 64 goes when it does not find an unfired rule. Step 112 checks to see if the hypothesis of node 63, which is still the MRWME, supports any other unfired rules. If so, step 62 would be repeated, using the next lowest FPF from this node. In FIG. 2, the branch having an FPF of two would be explored.

When step 112 finds no unused paths, step 114 checks to see if the program has been moved back to the start of the working memory elements WME, referring to the relative times that the rules fired. If not, step 116 drops back one WME in time, which would be to node 65 associated with rule (e), and step 118 places this WME in program location X. The program will find rule (h) is unable to fire from node 65, for the same reasons as from node 63, and the program would loop and come back to step 116, which would drop the program back to node 118 associated with rule (d). Since rule (h) did not fire, there would be no evidence at its node 120. Thus, when the program drops back to node 118, rule (i) would not be able to fire. The program would then drop back to node 122. Rule (j) would try to fire, which it cannot because the evidence at node 124 associated with rule (i) is missing. Step 112 will find another path from node 122 and the program will try to fire rule (l), with the branch from node 122 to node 126 associated with rule (l) being a NOT branch. Rule (l) cannot fire because the evidence associated with node 124 is missing. The program then drops back to node 128 associated with rule (g), and rule (g) will fire if its CF is within the associated CFT range, because both inputs to node 130 are known. If rule (g) fires, i.e., if step 104 finds that the CF is within the associated CFT range, step 104 will advance to step 140 which stores the time that node 130 became a WME. Step 142 checks to see if the associated node has a signal attached to it, which will be found in the node format of Table VI. If a signal is found, it will be tested by the parameters necessary for firing the signal. If the test parameters are met, step 144 outputs the signal to the appropriate device from an output port 38 shown in FIG. 1. When rule (g) fires, the hypothesis indicated by node 130 is used as evidence for higher object level rules. This hypothesis is that hatch door is not locked, or the car door is not closed, and the CF of this hypothesis indicates the measure of belief or measure of disbelief in this hypothesis.

Steps 142 and 144 both proceed to step 146 which checks to see if the node being considered is used as evidence for a higher rule. If so, the program returns to step 60. If not, it indicates a malfunction node has been reached. In this instance, the program advances to step 60, which stores the MRWME in program location X, and step 62 will try to fire rule (k) associated with node 132. It will find that the evidence at node 134 associated with rule (j) is missing, and thus, the rule cannot fire. Node 130 is now the MRWME. Thus, when step 116 drops back one WME, it will find the next most recent WME is node 63. This time, step 102 will find flag CFT set, step 110 will reset the CFT flags associated with rule (h), and step 110 skips the CFT test in step 104, automatically firing rule (h). This advances the program and propagates belief past the point where it previously stalled, with the skipping of the CFT test lasting for only one rule each time it is applied. When rule (h) fires, the hypothesis that the car is not at floor level becomes evidence for higher level object level rules, with the CF associated with this rule being stored in the hypothesis node format, as shown in Table VI.

Node 120 will now be the MRWME, and the program will find rule (i) in step 62. Step 66 will find all of the inputs known, and rule (i) will fire if its CF is within its CFT range. If the CF of rule (i) is not within the CFT range, the program will explore the second path from node 120. If unsuccessful, it will drop back and try all of the other WME's one by one, and eventually come back to node 120 and fire rule (i), without the CFT test. When rule (i) fires, the hypothesis that the car is not at floor level and not releveling becomes evidence for higher object level rules, along with the CF in the belief of this hypothesis.

When rule (i) fires, rule (j) will fire, either immediately by passing the CFT test, or later by skipping the CFT test. If it doesn't pass the CFT test, the program will try to fire rule (l), before leaving node 124 to backtrack through the WME's. When rule (j) fires, the hypothesis that the car is not at floor level, it is not releveling, and not running, becomes evidence for higher object level rules, along with its confidence factor CF.

When node 134 associated with rule (j) becomes a WME, the program will also fire rule (k), either immediately by passing the CFT test, or later by skipping the test. When rule (k) fires, its signal 150 will be fired if the firing tests are met, which include the CF being above a predetermined level. The signal, if fired, may sound local and/or remote alarms, to modify the operation of the system 12, and the like. When rule (k) fires, the hypothesis that the car is not at floor level, it is not releveling, not running, and the car or hatch doors are not closed or locked, is placed in evidence. Since this hypothesis, if true, is a malfunction, node 132 does not support any higher level object level rules. The signal 150 will not fire, unless the confidence factor in this hypothesis is above a certain level. Thus, just because the program advances to a malfunction node, does not mean that the associated malfunction has actually occurred. The CFT test is used to try to quickly get to the malfunction node level, when the evidence points to a malfunction, but lacking a good direct path to the malfunction node, the program explores all paths to the malfunction node level, ending up with confidence factors of $-1$, or near $-1$, when malfunctions do not exist.

When rule (k) fires, step 146 will find that node 132 is not used as evidence, and step 152 checks to see if all rules have been evaluated. If not, step 152 goes to step 116 to start a search for other paths and rules. If all rules have been evaluated, it is time to update the sensor supported nodes and thus the process starts all over again. This on-line processing continues, only outputting malfunction-related signals when a malfunction node is reached and the believability in the malfunction hypothesis exceeds a predetermined level.

Figure 7:
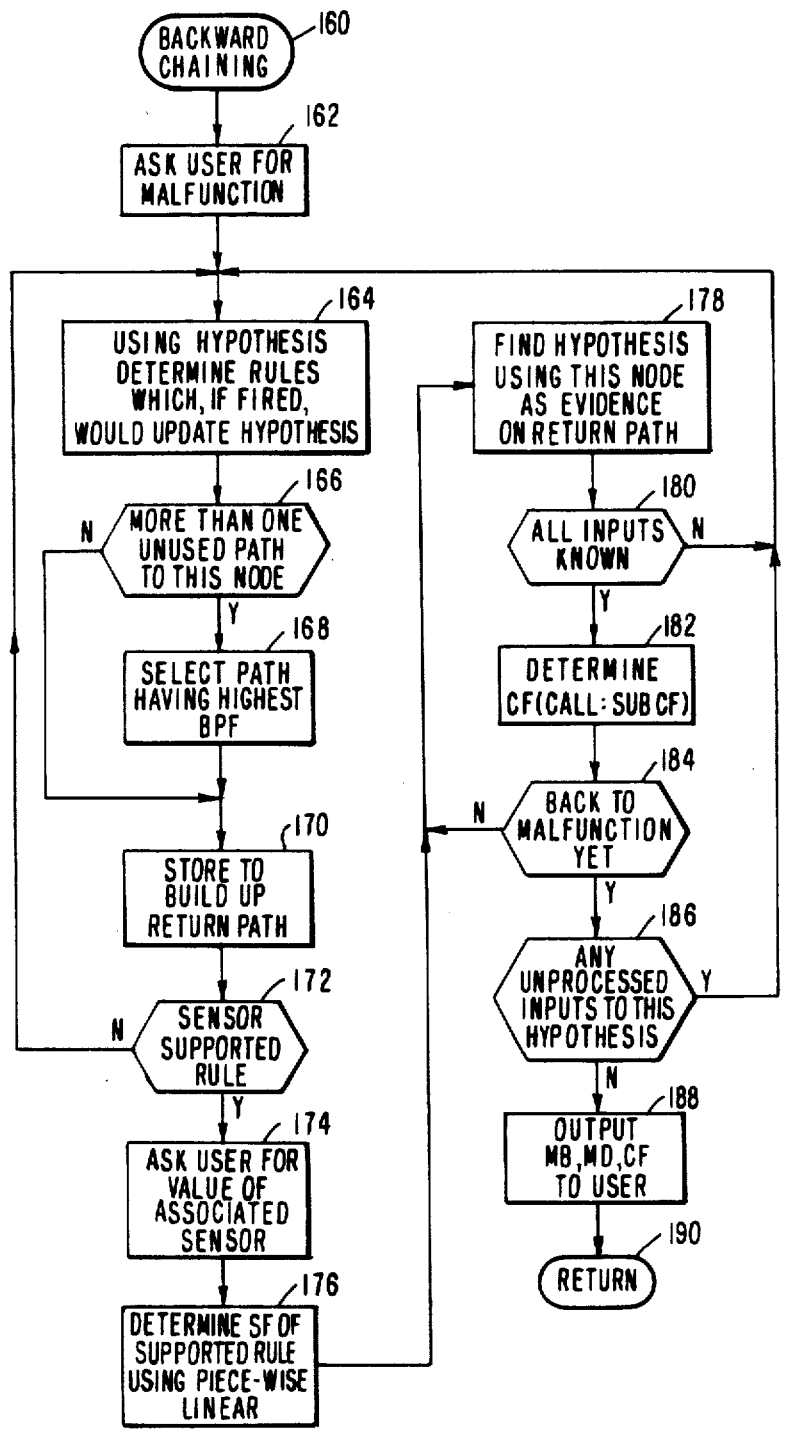
FIG. 7 is a procedural flow chart which sets forth a backward chaining process, as conducted according to the teachings of the invention.

FIG. 7 is a procedural flow chart for backward chaining. In this user selected mode, the meta-level rules help the user troubleshoot, with the user only knowing that a malfunction has occurred. The user enters the malfunction into the program, and the program establishes the highest priority path back to a sensor, and will output to the user the name of the sensor which should be checked. When the user inputs the value or condition of the indicated sensor, the program proceeds back towards the malfunction node along the high priority path originally established, back chaining as required when it finds that inputs are not known, to ask the user for additional sensor values. The MB, MD and CFs are calculated while the program progresses towards the malfunction node level, but the CFT test is not used in backward chaining because the user wants the system to find the confidence in the specified malfunction, regardless of what the actual malfunction is. This mode is useful when the user suspects a malfunction and wishes to confirm, or disaffirm, his suspicions without spending time considering other malfunctions.

More specifically, the backward chaining program is entered at 160 and step 162 asks the user to input the malfunction. Step 164, using the hypothesis, searches the list of domain specific object-level rules to determine which rule, or rules, if fired, would update this hypothesis. Step 166 then determines if there is more than one path to this hypothesis which has not already been explored. When the rules are formulated, backward path factors BPF are provided by the domain expert to list the alternatives in the order they should be explored. Thus, if there is more than one path from the node in question, back towards the sensor nodes, step 168 selects the path having the highest BPF. In the example of FIG. 2, if the malfunction input by the user is associated with malfunction node 132, step 164 would find rule (k), and step 166 would take the backward path to node 134, since it has the highest BPF, as indicated in FIG. 2. Step 172 stores the backward path it is taking, node-by-node, for use on the later return to the malfunction node. Step 172 then determines if the node it has reached is associated with a sensor supported rule. If not, the program returns to step 164. In the example, the program would step backwardly from node 134 to node 124, to node 120, and finally to node 63, always taking the path having the highest BPF from each node. When node 63 is reached, step 172 branches to step 174, which asks the user for the value or condition of sensor LU. Now the program is ready to proceed back towards malfunction node 132 along the basic path it constructed on the way to sensor LU. Each time the program finds it needs more evidence, the program will backward chain to a sensor and ask the user for this evidence, and then it will go back up the same basic path it originally established.

More specifically, step 176 determines the SF of the supported rule (f), using the piece-wise linear function hereinbefore described. Step 178 searches the object rule list to find a hypothesis which uses node 63 as evidence, sticking to the rules which follow the basic path. Thus, step 178 will find rule (h). Step 180 checks to see if all of the inputs to rule (h) are known. If they are not known, step 180 returns to step 164, and using the hypothesis of rule (h), it finds that the only unused path to node 120 goes back to node 65 associated with sensor LD. Step 174 asks the user for the value or condition of sensor LD, and step 176 determines the SF of rule (e). Step 178 will find rule (h), and step 180 will now find all the inputs for rule (h) are known. Step 182 calls the subroutine CF shown in FIG. 6, to determine the CF of rule (h). Step 184 checks to see if the program has arrived back at the starting malfunction node. If not, step 184 returns to step 178. When step 184 finds the program has arrived back at the starting malfunction node, step 186 checks to see if there are any unprocessed inputs to the malfunction node, (i.e., Are there any other rules which use this hypothesis as evidence?). If so, step 186 returns to step 164 to take another path from node 132 back to the sensor level, and the program will return along this path to update the CF of the malfunction node. When step 186 finds that there are no unprocessed inputs to the malfunction node 134, step 188 outputs the MB, MD and CF to the user. Since the path it used in its conclusion is stored, it may also output the reasons why it selected the particular inputs and came to its conclusion. The program returns control to the user at 190.

Another user interactive mode enables a user to input any number of sensor values of specific interest, and the program forward chains from these inputs until encountering missing evidence. The program then backward chains to determine the sensors which can provide the missing evidence, and the program asks the user to input the associated values. The program then alternates between forward and backward chaining, as required, to find other missing bits of evidence, until reaching a malfunction node. The confidence factors of the hypotheses are also calculated by the program and tested with the associated CFT values, as in the FIG. 4 embodiment. A new concept related to confidence factor assumption (CFA) is also introduced in this program, but it can also be used in the FIG. 4 embodiment. This embodiment of the invention is set forth in detail in FIGS. 8A, 8B, and 8C, which may be combined to form a procedural flow chart for this mixed inference mode of chaining.

Figure 8A:
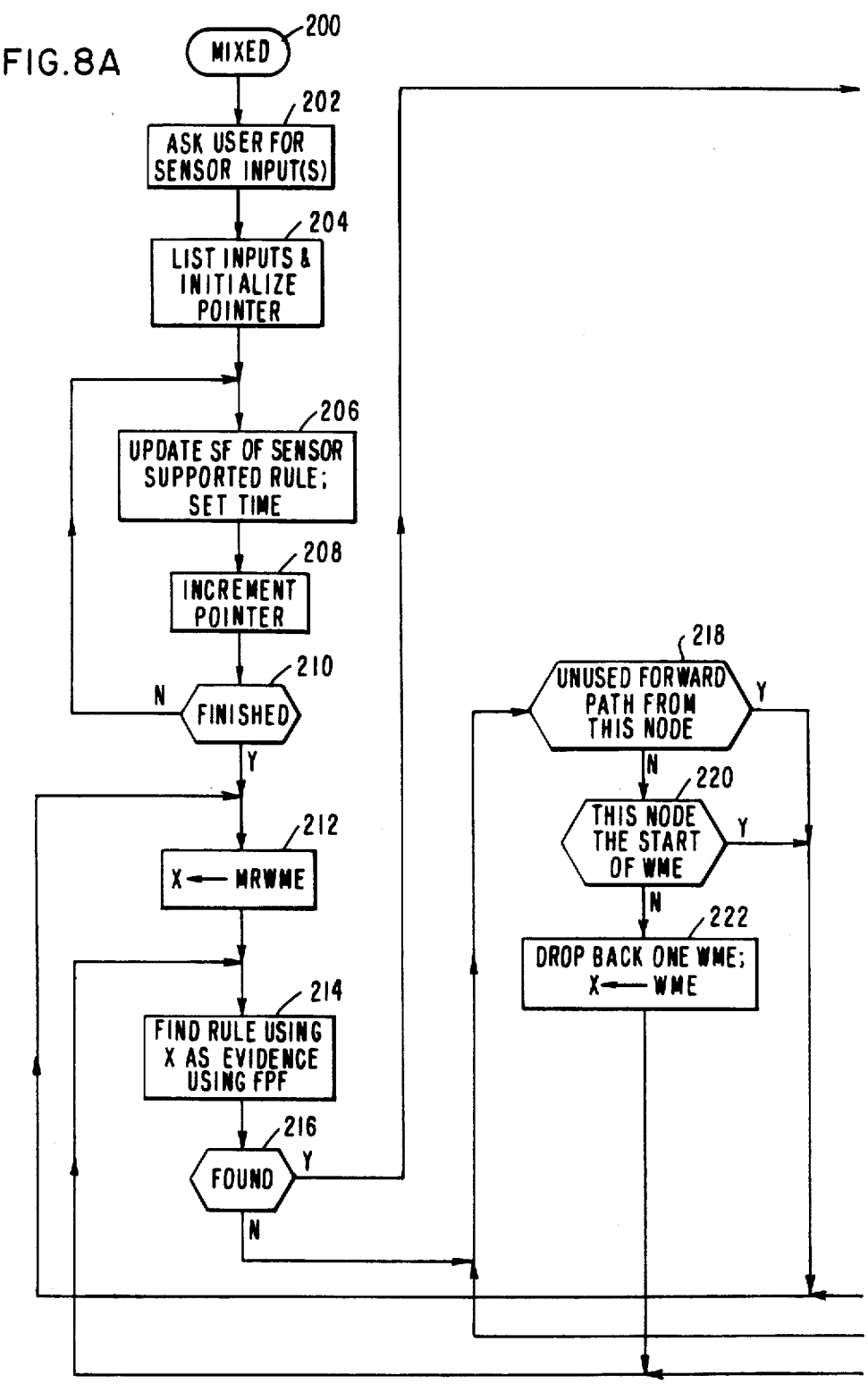
FIGS. 8A, 8B and 8C may be assembled to provide a procedural flow chart which sets forth mixed inference chaining, as conducted according to the teachings of the invention.
Figure 8B:
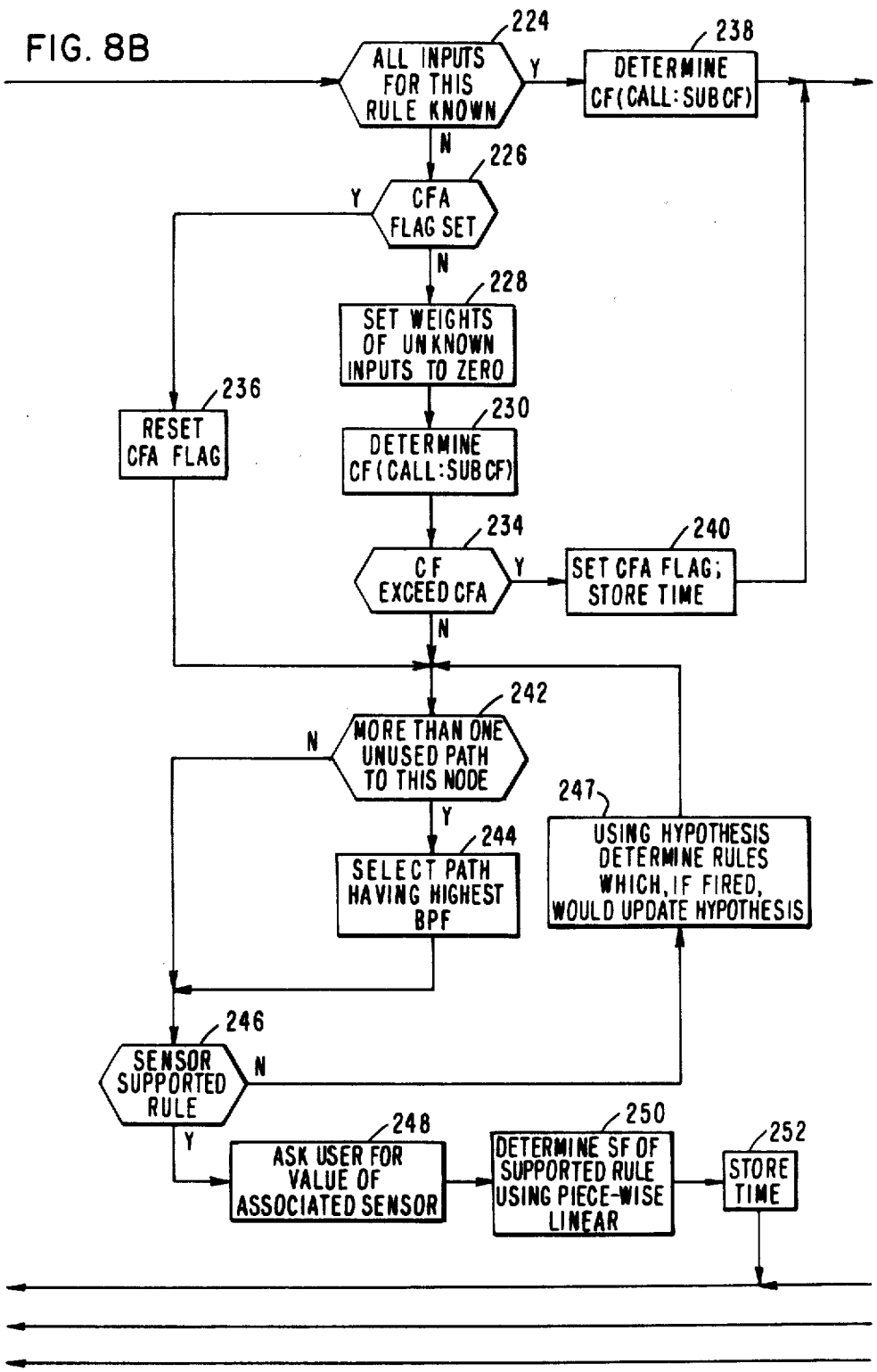
Figure 8C:
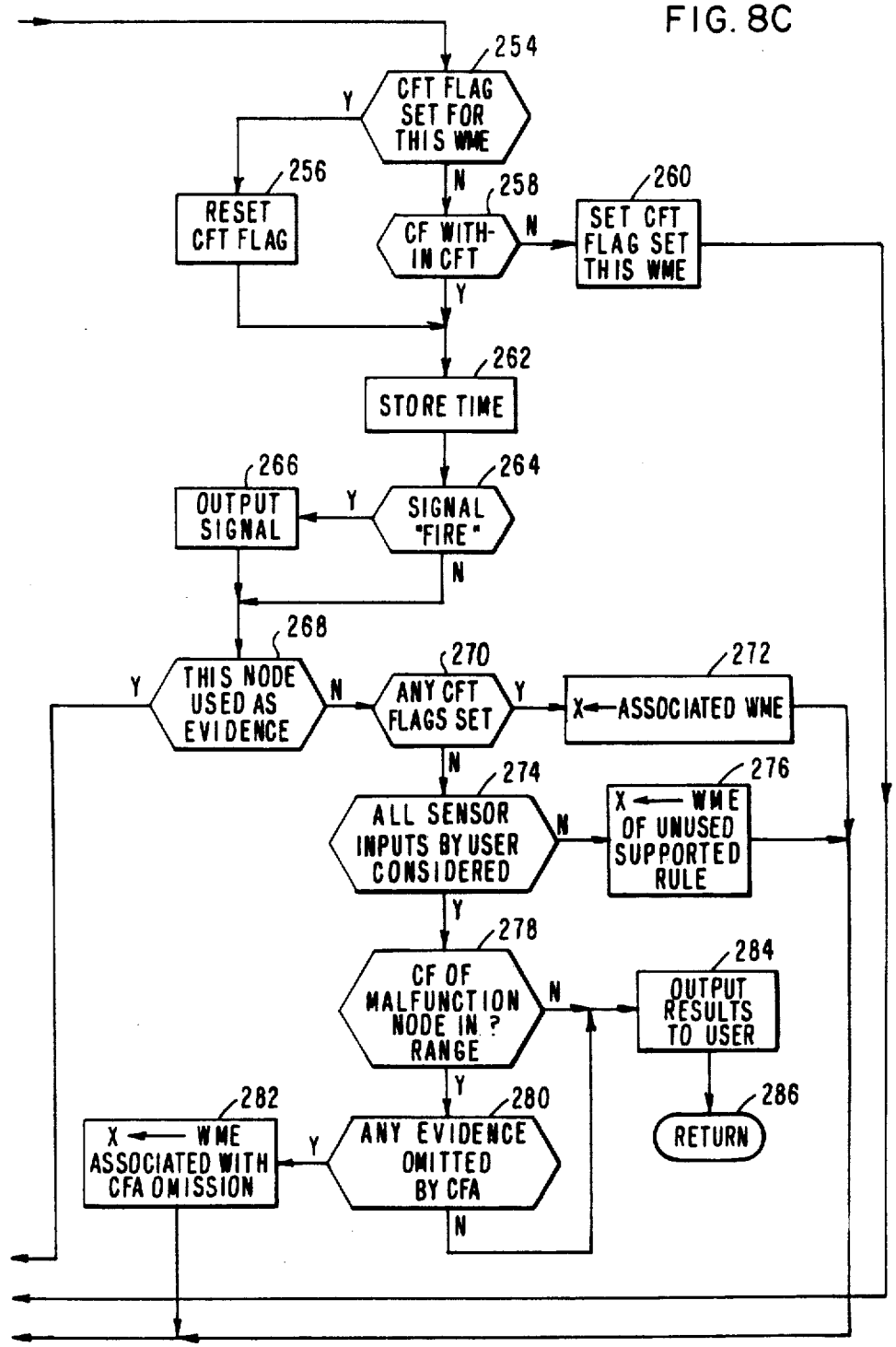

More specifically, the mixed program is entered at 200 of FIG. 8A and step 202 asks the user for the sensor inputs which the user thinks are significant or pertinent. Step 204 lists the inputs and initializes a pointer to the head of the list. Step 206 updates the SF of the sensor supported rule, and sets the time at which each associated node becomes a WME. Step 208 increments the list pointer, and step 210 checks to see if all sensor supported rules have been updated. Step 210 returns to step 206, until all sensor supported nodes are updated.

Step 210 proceeds to step 212 where the WRWME is placed in program variable X, and step 214 searches the object rules to find a rule which uses X as evidence. The forward path factor FPF is used if there is more than one choice from the node of the WRWME. Step 216 checks to see if a rule has been found. If it has, step 224 checks to see if all inputs are known. If they are, step 238 calls subroutine CF (FIG. 6) to determine the CF of the hypothesis of the rule. Step 254 checks the CFT flag, and if it is not set, step 258 compares the CF with the CFT range. If the CF is within the CFT range, step 262 stores the time the rule fired and its associated node became a WME. Step 264 checks to see if a signal is attached to this WME, and if so, it checks to see if the conditions are satisfied which fire the signal. If the conditions are satisfied, step 266 outputs the signal and goes to step 268. If a signal is not fired, step 264 proceeds to step 268. Step 268 determines if this node is used as evidence for a higher level object-level rule. If so, it is an intermediate node, and the program returns to step 212 to continue the forward chaining process.

If step 258 finds that the CF of the hypothesis is not within the CFT range, step 258 branches to step 260 which sets the CFT flag for this WME. Step 260 proceeds to step 218, as does step 216 when no rule is found. Step 218 checks for other forward paths from the present WME. If there is another path, step 218 returns to step 212 to explore this path. If there is no other forward path, step 220 checks to see if the present node is at the very start of the WME's. If so, step 220 returns to step 212. If it is not the starting WME, step 220 goes to step 222 which drops back one WME in time, and this WME is placed in X. Step 222 returns to step 214.

When step 224 finds that all inputs to the rule are not known, it checks to see if the confidence factor assumption flag CFA is set. If it is not set, step 228 sets the weights of unknown inputs to zero, and step 230 calls subroutine CF (FIG. 4) to determine the confidence factor CF. Step 234 checks to see if the CF exceeds the CFA value, which is a constant stored in memory. It may be a universal constant applicable to all object rules, or it may be node related, having a specific value for each node, as desired. If the CF exceeds the CFA value, it is assumed that there is enough evidence to continue at this time, without backward chaining to pick up the missing evidence. Step 240 sets a CFA flag for this node, to note that it was processed without complete evidence. Step 240 also stores the time the CFA flag was set, and step 240 proceeds to step 254 to make the CFT test. As hereinbefore stated, steps 226 through 240 may also be applied to the FIG. 4 embodiment, following step 66 of FIG. 4. Steps 226 through 240 may also be omitted in the present mixed chaining embodiment, if desired.

If step 234 finds the CF of the hypothesis does not exceed the CFA value, step 234 proceeds to step 242 to begin backward chaining, using the backward path factors BPF. Step 242 checks to see if there is more than one unused path to the hypothesis of the rule found in step 216. If so, step 244 selects the path having the highest BPF. Step 246 determines if the node associated with the unknown evidence is associated with a sensor supported rule. If not, step 247 uses the hypothesis associated with the node to look for a rule, which, if found, would update the hypothesis. Step 247 returns to step 242, with the loop including steps 242, 244, 246 and 247 being repeated until step 246 finds a node associated with a sensor supported rule. Step 248 then asks the user for the sensor value or its condition, step 250 determines the SF of the sensor supported rule, and step 252 stores the time at which the node became a WME. Step 252 returns to step 212, to again start forward chaining.

When step 268 finds a malfunction node, step 268 proceeds to step 270 to check CFT flags. If any are set, it means that some path, or paths, which might update the malfunction node, has not been processed. These may be processed at this time, or they may be omitted, especially if the CF of the malfunction node exceeds a predetermined value, as desired. If processed, step 270 may proceed to step 272 which stores the WME associated with a set CFT flag in X, and step 272 returns to step 214 for forward chaining from this point, with step 254 taking the "yes" branch to skip the CFT test for this one rule.

If there are no CFT flags set, step 270 proceeds to step 274 which checks to see if all sensor inputs by the user have been considered. If not, step 276 stores the WME associated with a sensor supported rule which has not been used as evidence in the rule network, and step 276 returns to step 214.

If step 274 finds all sensor inputs by the user have been considered, step 278 checks to see if the CF of the malfunction node is in a questionable range. If it is, step 280 checks to see if any CFA flags are set, indicating evidence has been omitted from the CF determination. If the CF is in a questionable range and step 280 finds a CFA flag set, step 282 stores a WME associated with a set CFA flag, and the program returns to step 214. When the program reaches step 226, it will find the CFA flag set, and step 236 resets this flag while skipping steps 228, 230 and 234, proceeding directly to the start of backward chaining to determine the unknown input, or inputs.

If step 278 finds the CF is not in a questionable range, or if step 280 finds no evidence has been omitted in the determination of CF, step 284 outputs the results to the user, and the program returns to user control at 286.

In summary, there has been disclosed new and improved methods and apparatus for sensor and interactive based fault diagnosis. The entire control process is implemented in a meta-level rule structure completely distinct from the object-level rule base. Thus, the entire inference process is implemented entirely in a meta-level rule structure. This architecture provides great flexibility in designing a diagnostic and control system to meet any specified need.

The invention also teaches a mixed inference mode which enables a user to input any number of sensor values or conditions, and the diagnostic system will forward and backward chain, as required, to indicate what additional information is required to reach a conclusion relative to the believability of a malfunction hypothesis. A new method of using confidence factors, such as the CFT method, permits the diagnostic procedures to retreat, at least temporarily, from unproductive paths, to explore new paths, returning if necessary to continue paths originally thought non-productive when other paths are not any more promising. Another new method of using confidence factors, such as the CFA method disclosed, enables the diagnostic procedures to omit unknown evidence, at least temporarily, to see if any acceptable level of confidence can be obtained in a hypothesis without all of its evidence inputs. If it appears necessary, the program will backward chain to determine the missing evidence.

We claim as our invention:

1. A method of diagnosing faults in a predetermined system, comprising the steps of: providing domain specific rules, including rules in evidence-hypothesis form, to build a knowledge base of assertions relative to the predetermined system, maintaining said knowledge base free of information which makes inferences relative to the knowledge base, providing data relative to the predetermined system, providing inference rules, independent and distinct from said domain specific rules, which make belief propagating inferences in response to the data, by selecting and applying the domain specific rules, propagating belief in the hypotheses of selected domain specific rules, in response to the data, by the step of interconnecting the domain specific rules, under the control of the inference rules, into a rule network of hypothesis nodes interconnected by evidence, and outputting information in response to the belief propagating step.

2. The method of claim 1 including the step of dividing the inference rules into two levels, with the first level including task control rules which make inferences for controlling the selection and application of domain specific rules, and with the second level including procedural rules which make inferences for controlling the selection of the task control rules of the first level, when there is a choice.

3. The method of claim 1 wherein the inference rules include rules for the steps of:

determining when a belief propagating path appears unproductive, storing the information developed for an unproductive path, starting a new belief propagating path, and returning to an apparently unproductive path in response to predetermined conditions, using the information previously stored, to start at the point of previous termination.

4. The method of claim 1 wherein the domain specific rules include confidence factor threshold (CFT) values, and the inference rules include rules for the steps of:

developing a confidence factor for each hypothesis node in the propagating step, using the confidence factors of supporting nodes, comparing the developed confidence factor for each hypothesis node with an associated CFT value to determine when the present propagating path appears to be unproductive, storing the information relative to an apparently unproductive path, and returning to an apparently unproductive path in response to predetermined conditions, using the information previously stored to start at the point of previous termination.

5. The method of claim 1 wherein the domain specific rules include path factors which assign relative values to alternate paths from a node, which path factors are utilized by the inference rules in selecting domain specific rules.

6. The method of claim 1 wherein the domain specific rules include forward path factors which assign relative values to alternate paths from a node to supported rules, which path factors are utilized by the inference rules in selecting domain specific rules.

7. The method of claim 1 wherein the domain specific rules include backward path factors which assign relative values to alternate paths from a node to supporting rules, which path factors are utilized by the inference rules in selecting domain specific rules.

8. The method of claim 1 wherein the domain specific rules include confidence factor threshold (CFT) values, and the inference rules include rules for establishing the steps of:

developing a confidence factor for each hypothesis node in the propagating step, utilizing the confidence factors of supporting nodes, comparing the developed confidence factor for each hypothesis node with the CFT values, firing the associated rule, to continue the present propagating path, when the comparison is within the CFT values, noting the relative firing times of the rules in working memory elements (WME), terminating the present propagating path when the comparison is outside the CFT values, storing information relative to the terminated path, and looking for a new belief propagating path from the hypothesis nodes of fired rules, using the relative firing times stored in the WME's, to select the order.

9. The method of claim 8 wherein the inference rules include rules for establishing the step of returning to the most recent WME to continue a terminated belief path, in response to predetermined conditions.

10. The method of claim 9 wherein the step of returning to the most recent WME includes the step of disregarding the CFT comparison step, for at least one rule, to advance belief propagation by firing the associated rule.

11. The method of claim 1 wherein the domain specific rules include values which assign relative weights to multiple pieces of evidence for a rule, and confidence factor assumption (CFA) values, and the inference rules include rules for propagating belief without obtaining all of the evidence for a hypothesis by the steps of developing a confidence factor CF for each hypothesis node, setting the weight of a missing piece of evidence to zero, comparing the confidence factor CF with the CFA value, and continuing without the missing evidence when CF exceeds the CFA value.

12. The method of claim 11 wherein the inference rules include rules for establishing the step of returning to rules which were fired with missing pieces of evidence, in response to predetermined conditions.

13. The method of claim 12 wherein the domain specific rules include rules which have a malfunction hypothesis, with a predetermined condition which will trigger the return to a rule fired with missing evidence is a CF of a malfunction hypothesis being in a predetermined range.

14. The method of claim 1 wherein the step of providing data includes the step of providing sensor data, the step of providing domain specific rules includes providing values which enable a sufficiency factor SF to be determined for each sensor, and the step of providing inference rules includes the step of determining the SF for each sensor supported rule.

15. The method of claim 1 wherein the step of providing domain specific rules includes the step of assigning values SF to the rules based upon the confidence that the evidence, when present, supports the hypothesis, and values NF to the rules based upon the necessity of the evidence to the belief of the hypothesis, when substantiating evidence is not present.

16. The method of claim 1 wherein the step of providing data includes the step of providing sensor inputs, the step of providing domain specific rules includes the step of assigning a confidence factor CF to each sensor, and the inference rules include the steps of developing a sufficiency factor SF relative to the data provided by a sensor based upon its value, and developing a measure of belief MB relative to the sensor data equal to the product of the CF and SF.

17. The method of claim 15 wherein the step of providing inference rules includes rules for determining a measure of belief MB in the hypothesis, determining a measure of disbelief MD in the hypothesis, by utilizing SF and NF, and for determining a confidence factor in the hypothesis according to the difference between MB and MD.

18. The method of claim 1 wherein the step of providing data includes the step of providing sensor data, and the step of providing domain specific rules includes malfunction hypotheses, and wherein the inference rules include rules for forward chaining from known sensor inputs, until nodes are reached requiring unknown evidence, and rules for backward chaining to establish additional sensor data required to provide the unknown evidence, with the forward and backward chaining continuing until a malfunction node is reached.

19. The method of claim 1 wherein the step of providing domain specific rules includes the step of attaching predetermined signals and associated conditions to predetermined hypotheses, and the inference rules include rules for outputting such signals when the associated hypothesis node meets the conditions for outputting the signal.

20. Apparatus for diagnosing faults in a predetermined system, comprising:
sensors for providing sensor data relative to the performance of the predetermined system,
a domain specific knowledge base, including a plurality of rules in evidence-hypothesis form, which make assertions relative to the predetermined system,
said knowledge base being free of information which makes inferences relative to the knowledge base,
domain independent inference rules, including first and second levels of inference rules,
means interconnecting said sensors, said domain specific knowledge base, and said domain independent inference rules,
said first level of inference rules including means for testing evidence portions of selected rules of said domain specific knowledge base in response to said sensor data, and means responsive to successfully tested (fired) rules for making belief propagating inferences relative to the hypotheses of the domain specific rules,
said second level of inference rules including means for determining which of the first level inference rules to apply when there is a choice,
and means for outputting signals relative to at least certain of the domain specific rules which fire when their evidence portions are tested.

21. The apparatus of claim 20 wherein the domain specific knowledge base includes sensor information relative to each sensor, and the inference rules include means responsive to said sensor information for determining the confidence factor CF of the sensor data.

22. The apparatus of claim 20 wherein the domain specific knowledge base includes values SF assigned to at least certain of the domain dependent rules based upon the confidence that the evidence, when present, supports the hypothesis, and values NF related to the necessity of the evidence to the belief of the hypothesis when it is missing, and the influence rules include means for determining a measure of belief MB and a measure of disbelief MD in the hypotheses of selected domain dependent rules, based upon the CF of the evidence and the SF and NF of the rules, and for developing a confidence factor CF responsive to the difference between MB and MD.

23. The apparatus of claim 22 wherein the domain specific knowledge base includes confidence factor threshold values CFT, and the inference rules include means for comparing the CF of a rule with a CFT value, firing the rule when the CF is within the CFT, and backing up to start a different path through the domain dependent rules when it is outside the CFT.

24. The apparatus of claim 23 wherein the inference rules include means for returning to a non-fired rule in response to predetermined conditions, and including means for firing the rule without regard to the CFT.

25. The apparatus of claim 20 wherein the output signals include control signals which modify the operation of the predetermined system.

26. The apparatus of claim 22 wherein the domain specific rules include values which assign relative weights to multiple pieces of evidence for a rule, and confidence factor assumption (CFA) values, and the inference rules include means for propagating belief without obtaining all of the evidence for a hypothesis, including means for developing a confidence factor CF for each hypothesis mode, means for setting the weight of a missing piece of evidence to zero, means for comparing the confidence factor CF with the CFA value, and means for continuing to propagate belief without the missing evidence when CF exceeds the CFA value.

27. The apparatus of claim 26 wherein the inference rules include means for returning to rules which were fired with missing pieces of evidence, in response to predetermined conditions.

28. The apparatus of claim 20 wherein the inference rules include means for:
determining when a belief propagating path appears unproductive,
means for storing the information developed for an unproductive path,
means for starting a new belief propagating path,
and means for returning to an apparently unproductive path in response to predetermined conditions, using the information previously stored, to start at the point of previous termination.

29. The apparatus of claim 20 wherein the domain specific rules include path factors which assign relative values to alternate paths from a node, and the inference rules include means for considering the path factors in selecting domain specific rules.

30. The apparatus of claim 20 wherein the domain specific rules include malfunction hypotheses, and wherein the inference rules include means for forward chaining from known sensor inputs, until nodes are reached requiring unknown evidence, means for backward chaining to establish additional sensor data required to provide the unknown evidence, and means for continuing forward and backward chaining until a malfunction node is reached.

31. A method of diagnosing faults in a predetermined system, comprising the steps of: providing domain specific rules having confidence threshold (CFT) values, including rules in evidence-hypothesis form, to build a knowledge base of assertions relative to the predetermined system, providing data relative to the predetermined system, providing inference rules which make belief propagating inferences in response to the data, by selecting and applying the domain specific rules, propagating belief in the hypothesis of selected domain specific rules, in response to the data, by the step of interconnecting the domain specific rules, under the control of the inference rules, into a rule network of hypothesis nodes interconnected by evidence, said step of propagating belief including the steps of:

(a) developing a confidence factor for each hypothesis node in the propagating step, using the confidence factors developed for supporting nodes, (b) comparing the developed confidence factor for each hypothesis node with the associated CFT value to determine when the present propagating path appears to be unproductive, (c) storing the information relative to an apparently unproductive path, and (d) returning to an apparently unproductive path in response to predetermined conditions, using the information previously stored to start at the point of previous termination, and outputting information in response to the belief propagating step.

32. The method of claim 31 wherein the step of returning to an apparently unproductive path includes the step of disregarding the CFT comparison step (b), for at least one rule, to advance belief propagation by firing the associated rule.

33. A method of diagnosing faults in a predetermined system, comprising the steps of: providing domain specific rules, including rules in evidence-hypothesis form, to build a knowledge base of assertions relative to the predetermined system, said domain specific rules including values which assign relative weights to multiple pieces of evidence for a rule, and confidence factor assumption (CFA) values, providing data relative to the predetermined system, providing inference rules which make belief propagating inferences in response to the data, by selecting and applying the domain specific rules, propagating belief in the hypotheses of selected domain specific rules, in response to the data, by the step of interconnecting the domain specific rules, under the control of the inference rules, into a rule network of hypothesis nodes interconnected by evidence, said belief propagating step propagating belief without obtaining all of the evidence for a hypothesis of the steps of: (a) developing a confidence factor CF for each hypothesis node, (b) setting the weight of a missing piece of evidence to zero, (c) comparing the confidence factor CF with the CFA value, and (d) continuing without the missing evidence when CF exceeds the CFA value, and outputting information in response to the belief propagating step.

34. The method of claim 33 wherein the domain specific rules include rules which have a malfunction hypothesis, and including the step of returning to a rule which was fired with missing evidence when the CF of a malfunction hypothesis is in a predetermined range.

* * * * *